(12) United States Patent
Goko

(10) Patent No.: US 7,200,197 B2
(45) Date of Patent: Apr. 3, 2007

(54) SEMICONDUCTOR INTEGRATED CIRCUIT

(75) Inventor: Hiroki Goko, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 739 days.

(21) Appl. No.: 10/649,931

(22) Filed: Aug. 28, 2003

(65) Prior Publication Data

US 2004/0078774 A1 Apr. 22, 2004

(30) Foreign Application Priority Data

Sep. 3, 2002 (JP) .............................. 2002-257572

(51) Int. Cl.
*H04L 7/00* (2006.01)
(52) U.S. Cl. ...................... 375/372; 375/354; 711/154; 711/167
(58) Field of Classification Search ................ 375/354, 375/371, 372; 711/100, 105, 111, 150, 154, 711/157, 167; 370/503, 507; 327/141, 144, 327/150, 153, 159, 161
See application file for complete search history.

(56) References Cited

U.S. PATENT DOCUMENTS 4,525,849 A * 6/1985 Wolf ........................... 375/372

5,272,728 A * 12/1993 Ogawa ........................ 375/372
5,905,766 A * 5/1999 Nguyen ...................... 375/354
5,996,052 A * 11/1999 Taniguchi et al. ........... 711/155

FOREIGN PATENT DOCUMENTS

JP 9-16655 6/1997
JP 2000113025 A 4/2000

* cited by examiner

*Primary Examiner*—Dac V. Ha
(74) *Attorney, Agent, or Firm*—Rabin & Berdo, P.C.

(57) ABSTRACT

A semiconductor integrated circuit includes first and second data paths, first to third flip flops and logic circuits. The first data path transfers input data. The first flip flop is coupled to the first data path for temporally storing data received from the first data path in response to a first clock signal that is delayed from a reference clock signal. One of the logic circuits receives data from the first flip flop and another logic circuit outputs output data. The second flip flop is connected between the logic circuits for transferring signal between them in response to the reference clock signal. The third flip flop is connected to another logic circuit for outputting the output data in response to a second clock signal that is advanced from the reference clock signal. The second data path transfers data received from the third flip flop.

4 Claims, 3 Drawing Sheets

SEMICONDUCTOR INTEGRATED CIRCUIT

BACKGROUND OF THE INVENTION

1. Field of the Invention

The present invention relates to a semiconductor integrated circuit for data processing in synchronization with a clock signal.

2. Description of the Related Art

With the realization of large-sized semiconductor integrated circuits, functional blocks (hard macros) already developed are reused as circuit patterns for labor savings of designing the semiconductor integrated circuits. Particularly, system vendors in the fields of consumer products, information, and communications provide a common interface specification standard for allowing the use of not only the hard macros self-designed but also the hard macros designed by other venders. The hard macros following the standard are called IP (Intellectual Property) or VC (Virtual Component) for registration. The IP or VC is utilized to allow the realization of combined hard macros supplied from various venders in the development of system LSIs. As examples of the hard macro, digital signal processors, A/D converters, and various memories are named.

Patent Document 1 (JP-A-2000-113025) describes the configuration and fabrication method of such the hard macro.

In the hard macro, its data input end is connected to a data input end of a flip flop (hereafter, it is called FF) on the input side and a data output end of an FF on the output side is connected to an output end of the hard macro through delay cells. Then, delay time of the delay cells is set so as to match data timing given to the FF on the input side from the data input end and data timing outputted to the data output end from the FF on the output side with timing of clock signals. Accordingly, the results of the hard macro are sequentially given to the subsequent hard macros in synchronization with the clock signals for assured processing.

SUMMARY OF THE INVENTION

However, the traditional semiconductor integrated circuit has problems below.

Since the clock signals in the hard macro are given to each of the FFs in phase, the maximum processing time allowed for internal circuits is fixed to a value that the setup time of the FF is subtracted from one cycle of a clock signal. On this account, in the case where delay in data paths between the hard macro and the external FFs is large, timing conditions cannot be satisfied, the cycle of the clock signal needs to be extended, and the processing speed is likely to be reduced. In addition, in the case where the processing time of a part of the internal circuits is long even though the processing time of most of the internal circuits is short, the cycle of the clock signal needs to be matched with the processing time of the internal circuit having a long processing time. Thus, it is difficult to shorten the processing time.

In a semiconductor integrated circuit including: a hard macro having a plurality of combinational circuits for performing predetermined logic processing and a plurality of flip flops for performing data transfer, the hard macro being registered as a circuit pattern beforehand; an input flip flop for taking input data in synchronization with a clock signal; an output flip flop for outputting output data in synchronization with the clock signal; a first data path for giving the input data taken in the input flip flop to the hard macro; and a second data path for giving data outputted from the hard macro to the output flip flop, the had macro is configured as below.

More specifically, the hard macro has a first flip flop for holding data given from the first data path at timing delayed from the clock signal, a second flip flop for performing data transfer between the plurality of the combinational circuits in synchronization with the clock signal, and a third flip flop for holding data outputted to the second data path at timing advanced from the clock signal for output.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

First Embodiment

Figure 1A:
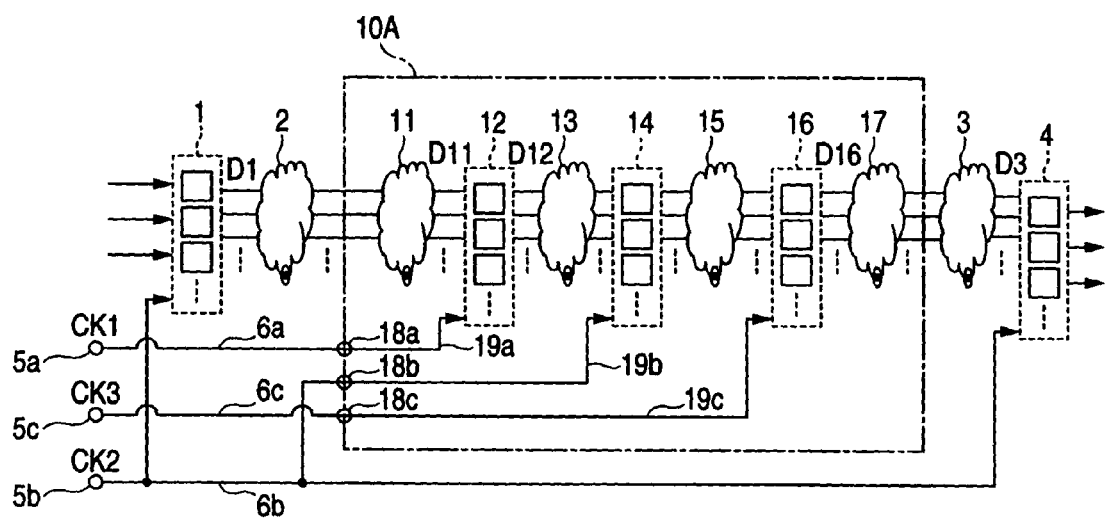
FIGS. 1A and 1B are explanatory drawings of a semiconductor integrated circuit illustrating a first embodiment according to the invention.
Figure 1B:
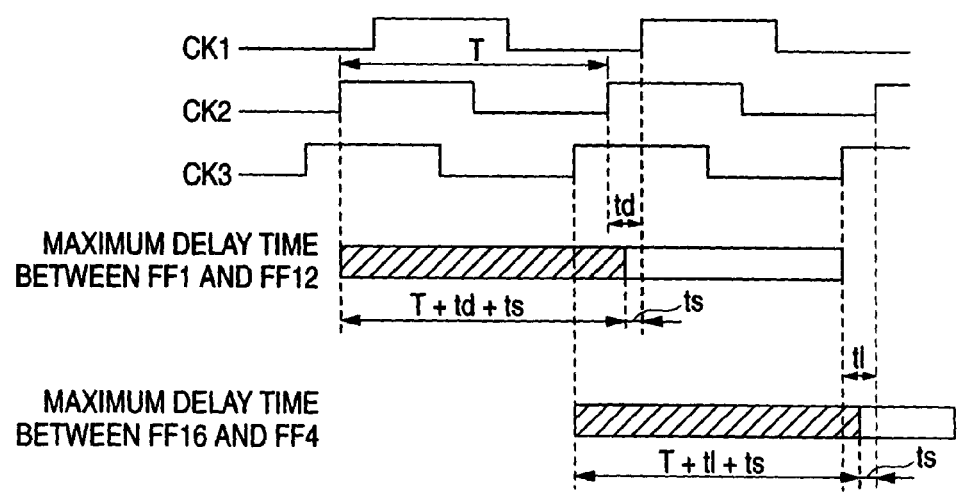

FIGS. 1A and 1B are explanatory drawings of a semiconductor integrated circuit illustrating a first embodiment according to the invention. FIG. 1A is a schematic block diagram, and FIG. 1B is an operation timing chart.

As shown in FIG. 1A, the semiconductor integrated circuit has a hard macro 10A, an FF group 1 and a combinational circuit 2 for forming a data path, both disposed on the input side of the hard macro 10A, and a combinational circuit 3 for forming a data path and an FF group 4, both disposed on the output side of the hard macro 10A.

The hard macro 10A has a plurality of combinational circuits 11 to 17 for forming data paths, FF groups 12 to 16 for connecting the combinational circuits 11 to 17 in between, and nodes 18a, 18b and 18c. The FF group 12 is connected to the node 18a through a clock wiring line 19a, the FF group 14 is connected to the node 18b through a clock wiring line 19b, and the FF group 16 is connected to the node 18c through a clock wiring line 19c.

The input side of the top combinational circuit 11 in the hard macro 10A is connected to the output side of the combinational circuit 2, and the output side of the last combinational circuit 17 at the backend is connected to the input side of a combinational circuit 3.

In addition, clock wiring lines 6a and 6c for feeding clock signals CK1 and CK3 from clock terminals 5a and 5c, respectively, are disposed for the nodes 18a and 18c in the hard macro 10A. Furthermore, for the FF groups 1 and 4 and the node 18b in the hard macro 10A, a clock wiring line 6b for feeding a clock signal CK2 from a clock terminal 5b in the same phase is disposed.

Next, the operation of the semiconductor integrated circuit shown in FIG. 1A will be described with reference to FIG. 1B.

As shown in FIG. 1B, the clock signal CK1 slightly delayed from the clock signal CK2 given to the clock terminal 5b is given to the clock terminal 5a. In the meantime, the clock signal CK3 slightly advanced from the clock signal CK2 is given to the clock terminal 5c.

In the FF group 1, data D1 outputted in synchronization with the rise of the clock signal CK2 reaches the input side of the FF group 12 as data D11 after processing (delay) time elapsed in the combinational circuits 2 and 11. In the FF group 12, the data D11 reached on the input side is held in synchronization with the rise of the clock signal CK1, and outputted as data D12. Therefore, the maximum allowable delay time between the FF group 1 and the FF group 12 is T+td−ts, where the cycle of the clock signal CK2 is T, the delay time of the clock signal CK1 is d1, and the setup time of the FF group 12 is ts.

Similarly, in the FF group 16, data D16 outputted in synchronization with the rise of the clock signal CK3 reaches the input side of the FF group 4 as data D3 after processing (delay) time elapsed in the combinational circuits 17 and 3. In the FF group 4, the data D3 reached on the input side is taken in synchronization with the rise of the clock signal CK2. Therefore, the maximum allowable delay time between the FF group 16 and the FF group 4 is T+tl−ts, where the cycle of the clock signal CK2 is T, the lead time of the clock signal CK3 is tl, and the setup time of the FF group 4 is ts.

As described above, the semiconductor integrated circuit of the first embodiment has the clock terminals 5a to 5c for feeding the different clock signals CK1 to CK3 to the FF groups 12 to 16 in the hard macro 10A, and the clock wiring lines 6a to 6c corresponding to the clock terminals 5a to 5c. Therefore, the clock signals fed to the FF groups 12 and 4 to take the data D11 and D3 can be delayed more than those fed to the FF groups 1 and 16 to output the data D1 and D16. Accordingly, there are advantages that the time allowed for data transfer can be prolonged, timing conditions are satisfied even in the same clock frequencies, and processing time can be shortened.

Second Embodiment

Figure 2:
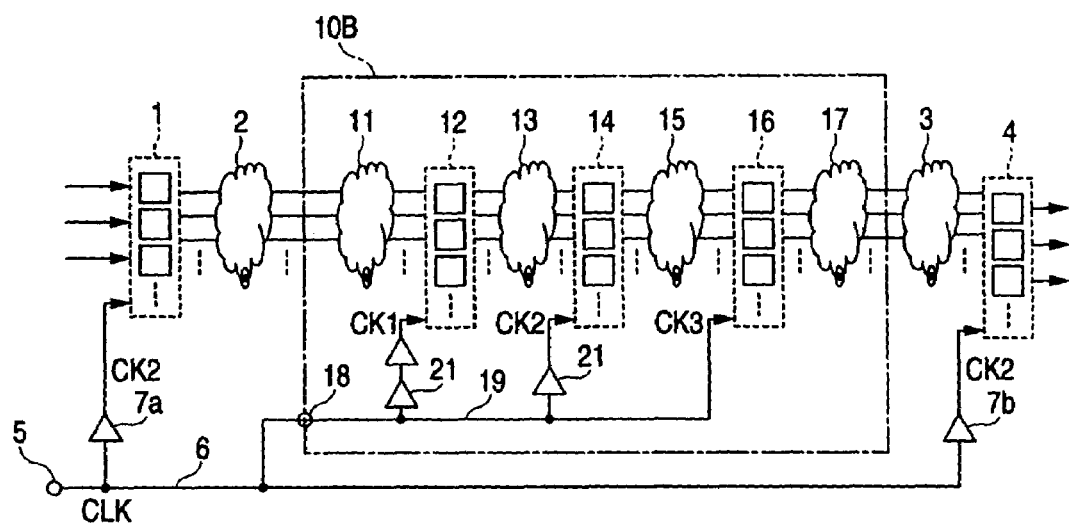
FIG. 2 is a schematic block diagram of a semiconductor integrated circuit illustrating a second embodiment according to the invention.

FIG. 2 is a schematic block diagram illustrating a semiconductor integrated circuit of a second embodiment according to the invention. The same components as those shown in FIG. 1 are designated the same numerals and signs.

The semiconductor integrated circuit has a hard macro 10B, an FF group 1 and a combinational circuit 2, both disposed on the input side of the hard macro 10B, and a combinational circuit 3 and an FF group 4, both disposed on the output side of the hard macro 10B.

The hard macro 10B has a plurality of combinational circuits 11 to 17, FF groups 12 to 16 for connecting the combinational circuits 11 to 17 in between, a node 18 fed with clock signal CLK, and a clock wiring line 19 for feeding clock signals to the FF groups 12 to 16 from the node 18. A clock signal CLK delayed by delay devices 21 and 22 for forming a unit for adjusting timing from the clock wiring line 19 is given to the FF groups 12 and 14 as clock signals CK1 and CK2. In addition, the clock signal CLK on the clock wiring line 19 is given to the FF group 16 as a clock signal CK3.

In the meantime, the clock signal CLK from a clock terminal 5 is fed to the FF groups 1 and 4 through delay devices 7a and 7b as the clock signal CK2 in phase with that fed to the FF group 14. Furthermore, the delay devices 22, 7a and 7b are that even numbered inverters are cascade-connected, for example. The delay amounts of the delay devices 22, 7a and 7b are set similarly, and the delay amount of a delay device 21 is set greater than those.

The operation of the semiconductor integrated circuit is the same as the operation of the semiconductor integrated circuit shown in FIG. 1, except that the clock signals CK1 and CK2 in the hard macro 10B are generated by the delay devices 21 and 22.

As described above, the semiconductor integrated circuit of the second embodiment has the delay devices 21 and 22 for generating the different clock signals CK1 to CK3 in the hard macro 10B. Accordingly, the semiconductor integrated circuit can generate the proper clock signals CK1 to CK3 in the hard macro 10B in accordance with the function of the hard macro 10B, having an advantage to allow a highly accurate operation, in addition to the advantage of the first embodiment.

Third Embodiment

Figure 3:
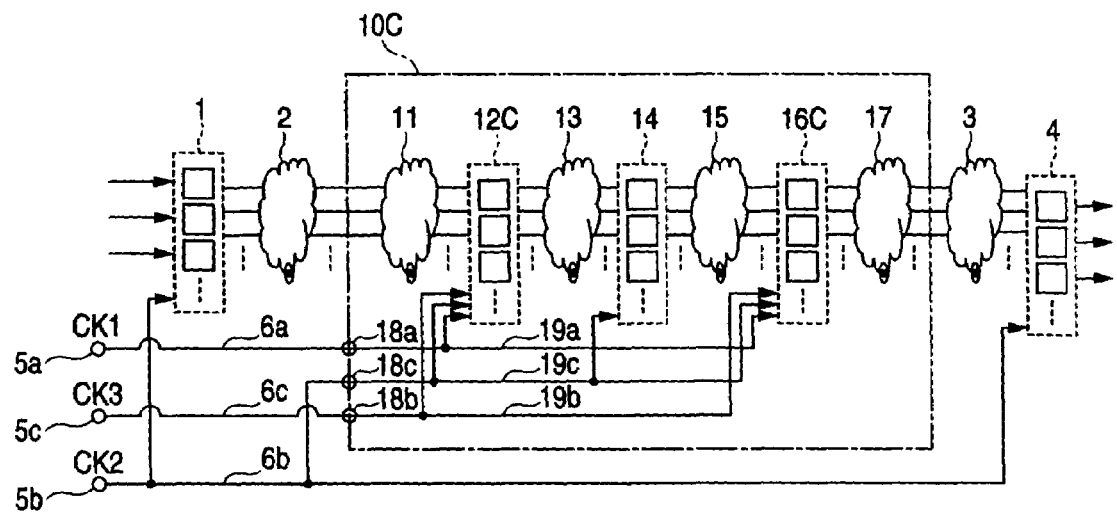
FIG. 3 is a schematic block diagram of a semiconductor integrated circuit illustrating a third embodiment according to the invention.

FIG. 3 is a schematic block diagram of a semiconductor integrated circuit illustrating a third embodiment according to the invention. The same components as those in FIG. 1 are designated the same numerals and signs.

The semiconductor integrated circuit has a hard macro 10C having a slightly different function instead of the hard macro 10A. More specifically, three kinds of clock signals CK1 to CK3 are fed to FF groups 12C and 16C in the hard macro 10C from nodes 18a to 18c through clock wiring lines 19a to 19c, and proper clock signals in the clock signals CK1 to CK3 are separately given. The other configurations are the same as those shown in FIG. 1.

The operation of the semiconductor integrated circuit is basically the same as the operation of the semiconductor integrated circuit shown in FIG. 1. However, since the proper clock signals among the clock signals CK1 to CK3 are fed to each FF in the FF groups 12c and 16C, the operation is performed at the best timing in accordance with the delay time of the signal.

As described above, the semiconductor integrated circuit of the third embodiment gives a plurality of the clock signals CK1 to CK3 having different timing to the FF groups 12C and 16C in the hard macro 10C, and feeds the clock signals having proper timing to each FF in the FF groups 12B and 16B. Accordingly, the semiconductor integrated circuit has an advantage that the clock signals having proper timing are given to each FF in the hard macro 10C and high-speed processing can be performed further highly accurately, in addition to the advantage of the first embodiment.

Fourth Embodiment

Figure 4:
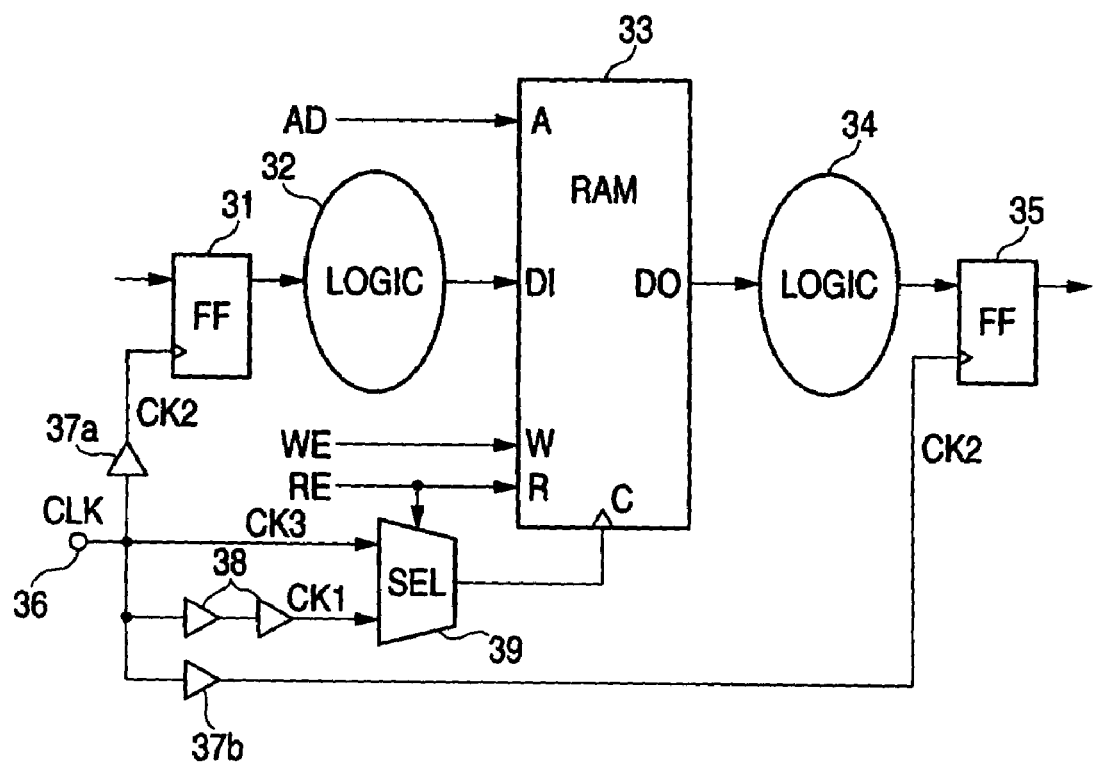
FIG. 4 is a schematic block diagram of a semiconductor integrated circuit illustrating a fourth embodiment according to the invention.

FIG. 4 is a schematic block diagram of a semiconductor integrated circuit illustrating a fourth embodiment according to the invention, in which timing of clock signals fed to a synchronous RAM (Random Access Memory) incorporated therein is controlled to intend that limited processing (delay) time is relaxed and processing time is shortened.

The semiconductor integrated circuit has FFs 31 and 35, combinational circuits (LOGIC) 32 and 34, a synchronous RAM 33, a clock terminal 36, delay devices 37a, 37b and 38, and a selector (SEL) 39 for forming a timing supplying unit. In addition, the delay times of the delay devices 37a and 37b are set nearly equal, and the delay time of the delay device 38 is set longer than them.

The FF 31 is that holds input data in synchronization with a clock signal CK2. A clock signal CLK given to the clock terminal 36 is delayed by the delay device 37a and fed the clock signal CK2. The combinational circuit 32 is connected to an output side of the FF 31, and an output side of the combinational circuit 32 is connected to an input terminal DI of the RAM 33.

The RAM 33 is that reads and writes data in synchronization with clock signals given to a clock terminal C. An address signal AD for an object to be accessed is given to an address terminal A, and a write control signal WE and a read control signal RE are given to control terminals W and R. The combinational circuit 34 is connected to an output terminal DO of the RAM 33, and the FF 35 is connected to an output side of the combinational circuit 34.

The FF 35 is that holds output data from the combinational circuit 34 in synchronization with the clock signal CK2. The clock signal CLK given to the clock terminal 36 is delayed by the delay device 37b, and fed as the clock signal CK2.

Furthermore, the clock signal CLK given to the clock terminal 36 is delayed by the delay device 38, and fed to a first input side of the selector 39 as clock signal CK1. It is also given to a second input side of the selector 39 as the clock signal CK3 as it is. In the selector 39, the second input side is selected when the read control signal RE is high (enable), and the first input side is selected when the signal is low (disable). An output side of the selector 39 is connected to the clock terminal C of the RAM 33.

Next, the operation will be described.

When data is written into the RAM 33, the read control signal RE is turned low, the selector 39 selects and gives the clock signal CK1 to the clock terminal C of the RAM 33. On the other hand, input data held by the FF 31 is given to the input side of the combinational circuit 32 in synchronization with the clock signal CK2. Since the clock signal CK1 has a delay amount greater than that of the clock signal CK2, delay (processing) time allowed for the combinational circuit 32 is longer than the cycle of the clock signal CLK.

When data is read out of the RAM 33, the read control signal RE is turned high, the selector 39 selects and gives the clock signal CK3 to the clock terminal C of the RAM 33. On the other hand, the clock signal CK2 is given to the FF 35 on the output side of the combinational circuit 34. Since the clock signal CK2 has a delay amount greater than that of the clock signal CK3, delay (processing) time allowed for the combinational circuit 34 is longer than the cycle of the clock signal CLK.

As described above, the semiconductor integrated circuit of the fourth embodiment uses the clock signal CK1 having delay longer than that of the clock signal CK2 fed to the FFs 31 and 35 when data is written in the RAM 33. In addition, the semiconductor integrated circuit uses the clock signal CK3 having delay shorter than that of the clock signal CK2 fed to the FFs 31 and 35 when data is readout of the RAM 33. Accordingly, the delay (processing) time allowed for the combinational circuit 32 and 34 is longer, and a reliable operation is feasible. Furthermore, the clock speed is increased, and the operating speed can be improved.

Moreover, the invention is not limited to the embodiments, which can be modified variously. As the modified example, the following are named.

(a) Three types of the clock signals CK1 to CK3 are used to adjust timing, but it is acceptable that a plurality of clock signals having different delay time is used.

(b) The numbers of the combinational circuits and the FF groups are not defined. They can be set freely in accordance with the function and scale of a semiconductor integrated circuit applied.

As described above, according to a first aspect of invention, the hard macro has the first FF for holding data given from the first data path at timing delayed from the clock signals, and the third FF for holding data to be outputted at timing advanced from the clock signals. Accordingly, limits on the delay time of data paths on the input and output sides are relaxed, and the processing time can be shortened.

According to a second aspect of the invention, the semiconductor integrated circuit has the delay devices for generating the clock signals for the input and output FFs, and the adjusting unit for adjusting the timing of the clock signals to be fed to each of the first to third FF groups in the hard macro. Accordingly, the timing of the clock signals does not need to be adjusted outside, and the hard macro can be operated at proper timing.

According to a third aspect of the invention, the semiconductor integrated circuit has the clock terminals and the clock wiring lines for inputting the clock signals from outside, the clock signals are given to the first to third FF groups in the hard macro. Accordingly, the clock signals can be given at any given timing, and the optimum time control can be totally performed.

According to a fourth aspect of the invention, the semiconductor integrated circuit has the timing supplying unit for giving a timing signal at timing delayed from the clock signal when data is written in the storage part and a timing signal at timing advanced from the clock signal when data is read out of the storage part. Accordingly, a limit on the delay time of the first data path is relaxed by the delay time of the timing signal when written, and a limit on the delay time of the second data path is relaxed by the lead time of the timing signal when read out.

What is claimed is:

1. In a semiconductor integrated circuit including: a hard macro having a plurality of combinational circuits for performing predetermined logic processing and a plurality of flip flops for performing data transfer, the hard macro being registered as a circuit pattern beforehand; an input flip flop for taking input data in synchronization with a clock signal; an output flip flop for outputting output data in synchronization with the clock signal; a first data path for giving the input data taken in the input flip flop to the hard macro; and a second data path for giving data outputted from the hard macro to the output flip flop, the hard macro comprising:
 a first flip flop for holding data given from the first data path at timing delayed from the clock signal,
 a second flip flop for performing data transfer between the plurality of the combinational circuits in synchronization with the clock signal, and
 a third flip flop for holding data outputted to the second data path at timing advanced from the clock signal for output.

2. The semiconductor integrated circuit according to claim 1, wherein the semiconductor integrated circuit has a delay device for delaying an external clock signal given from outside and generating a clock signal given to the input flip flop and the output flip flop, and
 the hard macro has an adjusting unit for adjusting timing of the external clock signal and feeding it to each of the first to third flip flops.

3. The semiconductor integrated circuit according to claim 1 comprising:
 clock terminals for inputting a clock signal given to each of the first to third flip flops from outside, and
 a clock wiring line for transmitting the clock signal inputted in each of the clock terminals to each of the first to third flip flops.

4. A semiconductor integrated circuit comprising:

a storage part for writing and reading data in synchronization with a timing signal;

an input flip flop for taking input data in synchronization with a clock signal;

an output flip flop for outputting output data in synchronization with the clock signal;

a first data path for giving the input data taken in the input flip flop to the storage part;

a second data path for giving data read out of the storage part to the output flip flop;

a timing supplying unit for giving a timing signal at timing delayed from the clock signal to the storage part when data is written in the storage part, and giving a timing signal at timing advanced from the clock signal to the storage part when data is read out of the storage part.

* * * * *